(12) United States Patent
Himori et al.

(10) Patent No.: US 9,859,146 B2
(45) Date of Patent: Jan. 2, 2018

(54) SEMICONDUCTOR MANUFACTURING DEVICE AND PROCESSING METHOD

(75) Inventors: Shinji Himori, Miyagi (JP); Yoshiyuki Kobayashi, Miyagi (JP); Takehiro Kato, Miyagi (JP); Etsuji Ito, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/238,860

(22) PCT Filed: Aug. 13, 2012

(86) PCT No.: PCT/JP2012/070630
§ 371 (c)(1),
(2), (4) Date: Feb. 14, 2014

(87) PCT Pub. No.: WO2013/024842
PCT Pub. Date: Feb. 21, 2013

(65) Prior Publication Data
US 2014/0213055 A1 Jul. 31, 2014

Related U.S. Application Data

(60) Provisional application No. 61/528,333, filed on Aug. 29, 2011.

(30) Foreign Application Priority Data

Aug. 17, 2011 (JP) ................................ 2011-178494

(51) Int. Cl.
*H01L 21/00* (2006.01)
*H01L 21/687* (2006.01)
(Continued)

(52) U.S. Cl.
CPC .. *H01L 21/68742* (2013.01); *H01L 21/30604* (2013.01); *H01L 21/67063* (2013.01)

(58) Field of Classification Search
CPC ......... H01L 21/68742; H01L 21/68778; H01L 21/67063; C23C 16/4586; C23C 16/4585
See application file for complete search history.

(56) References Cited

U.S. PATENT DOCUMENTS 5,352,294 A * 10/1994 White ................. C23C 16/4585
  118/725
5,838,528 A * 11/1998 Os et al. ........................ 361/234
(Continued)

FOREIGN PATENT DOCUMENTS

JP    2006196691 A  *  7/2006

OTHER PUBLICATIONS

International Search Report from corresponding application PCT/JP2012/070360, dated Oct. 30, 2012, 2 pages.

*Primary Examiner* — Gordon R Baldwin
*Assistant Examiner* — Charlee Bennett
(74) *Attorney, Agent, or Firm* — Rothwell, Figg, Ernst & Manbeck, P.C.

(57) ABSTRACT

A semiconductor manufacturing device includes a stage, a plurality of pins, and a driving unit. The stage includes a mounting surface. The mounting surface has a first region for mounting thereon a substrate, and a second region for mounting thereon a focus ring. The second region is provided to surround the first region. A plurality of holes is formed in the stage. The holes extend in a direction that intersects the mounting surface while passing through the boundary between the first region and the second region. The pins are provided in the respective holes. Each of the pins has a first and a second upper end surface. The second upper end surface is provided above the first upper end surface, and is offset towards the first region with respect to (Continued)

the first upper end surface. The driving unit moves the pins up and down in the aforementioned direction.

3 Claims, 7 Drawing Sheets

(51) Int. Cl.
  *H01L 21/306* (2006.01)
  *H01L 21/67* (2006.01)

(56) References Cited

U.S. PATENT DOCUMENTS

| | | | | |
|---|---|---|---|---|
| 6,044,534 | A * | 4/2000 | Seo | H01L 21/68707 29/25.01 |
| 6,676,759 | B1 * | 1/2004 | Takagi | H01L 21/68735 118/500 |
| 8,434,937 | B2 * | 5/2013 | Koelmel | H01L 21/68742 250/338.1 |
| 2002/0046810 | A1 * | 4/2002 | Tanaka | C23C 16/4401 156/345.51 |
| 2003/0173031 | A1 * | 9/2003 | Aggarwal | C23C 16/4584 156/345.51 |
| 2004/0139917 | A1 * | 7/2004 | Yamaguchi | C23C 16/4585 118/728 |
| 2006/0182528 | A1 * | 8/2006 | Fan | H01L 21/67109 414/155 |
| 2009/0067954 | A1 * | 3/2009 | Lanee | H01L 21/68742 414/172 |
| 2010/0024723 | A1 * | 2/2010 | Hasegawa | H01J 37/32743 118/500 |
| 2011/0159702 | A1 * | 6/2011 | Ohizumi | C23C 16/45551 438/778 |
| 2011/0287631 | A1 * | 11/2011 | Yamamoto | H01J 37/32568 438/710 |
| 2012/0033340 | A1 * | 2/2012 | Roy | H01L 21/67103 361/234 |
| 2012/0247671 | A1 * | 10/2012 | Sugawara | H01L 21/67346 156/345.31 |

* cited by examiner

SEMICONDUCTOR MANUFACTURING DEVICE AND PROCESSING METHOD

CROSS REFERENCE TO RELATED APPLICATIONS

This application is a national phase of PCT application No. PCT/JP2012/070630, filed on Aug. 13, 2012, which claims priority to Japanese Patent Application No. 2011-178494 filed on Aug. 17, 2011 with the Japan Patent Office, and U.S. Provisional Patent Application No. 61/528,333 filed on Aug. 29, 2011 with the USPTO, all of which are incorporated herein by reference.

FIELD OF THE INVENTION

Various aspects of the present invention relate to a semiconductor manufacturing device and a processing method.

BACKGROUND OF THE INVENTION

Patent Document 1 discloses a semiconductor manufacturing device. The semiconductor manufacturing device described in Patent Document 1 includes a stage and a plurality of pins. The stage has a plurality of holes into which the pins are respectively inserted.

Some of the pins are used for vertically moving a substrate to be processed, which is mounted on the stage, with respect to the top surface of the stage. The other the pins are used for vertically moving a focus ring mounted on the stage with respect to the top surface of the stage.

Patent Document 1: Japanese Patent Application Publication No. 2006-196691

In the above semiconductor manufacturing device, a plurality of driving units for vertically moving the pins is required as many as the number of the pins, so that the device becomes complicated. Further, in the above semiconductor manufacturing device, holes as many as the number of pins need to be formed in the stage. However, it is preferable to form a smaller number of holes in the stage.

SUMMARY OF THE INVENTION

Therefore, in this technical field, a semiconductor manufacturing device capable of vertically moving a substrate to be processed and a focus ring with a small number of pins is required.

A semiconductor manufacturing device in accordance with an aspect of the present invention includes: a processing chamber, a stage, a plurality of pins and a driving unit. The processing chamber defines a processing space. A stage is provided in the processing chamber. The stage has a mounting surface which has a first region for mounting thereon a substrate to be processed and a second region for mounting thereon a focus ring. The stage has a plurality of holes. The pins extend in a direction that intersects the mounting surface while passing through a boundary between the first region and the second region. The second region is disposed to surround the first region. The pins are respectively provided in the holes, each having a first upper end surface and a second upper end surface. The second upper end surface is offset towards the first region with respect to the first upper end surface, and the second end surface is provided above the first upper end surface. The driving unit is configured to vertically move the pins in the extending direction of the holes.

In this semiconductor manufacturing device, the substrate to be processed can be lifted from the mounting surface by moving upward the pins such that only the second upper end surfaces protrude from the mounting surface of the stage. Further, the focus ring can be lifted form the mounting surface by moving upward the pins such that the first upper end surfaces protrude from the mounting surface of the stage. Specifically, each of the pins has an end surface that comes into contact with the substrate and an end surface that comes into contact with the focus ring. Accordingly, in accordance with this semiconductor manufacturing device, the substrate to be processed and the focus ring can be vertically moved with a small number of pins.

In an embodiment, the semiconductor manufacturing device further may include a control unit. The control unit may control, in a first mode, the driving unit to drive the pins such that the second upper end surfaces of the pins protrude beyond the mounting surface and control, in a second mode, the driving unit to drive the pins such that the first upper end surfaces of the pins protrude beyond the mounting surface. In other words, the semiconductor manufacturing device may include a control unit configured to control the driving unit.

In accordance with another aspect of the present invention, there is provided a processing method using the semiconductor manufacturing device. The method includes: (a) mounting the focus ring on the second region; (b) mounting the substrate on the first region; (c) processing the substrate in a state where the substrate is mounted on the first region and the focus ring is mounted on the second region; (d) moving upward the pins such that the second upper end surfaces of the pins protrude beyond the mounting surface of the stage; (e) unloading the substrate, which is lifted up by the pins, from the processing chamber; (f) moving upward the pins such that the first upper end surfaces of the pins protrudes beyond the mounting surface; and (g) unloading the focus ring, which is lifted up by the pins, from the processing chamber.

In accordance with the above processing method, the substrate and the focus ring can be lifted up from the mounting surface with a small number of pins.

In an embodiment, the focus ring and the substrate may be respectively mounted on the second region and the first region by moving downward the pins in a state where the substrate and the focus ring are simultaneously supported by the pins above the mounting surface. Further, after the substrate and the focus ring are lifted up at the same time from the mounting surface by the pins, the substrate may be unloaded and the focus ring may be unloaded.

EFFECT OF THE INVENTION

As described above, in accordance with various aspects of the present invention, there are provided a semiconductor manufacturing device capable of vertically moving a substrate to be processed and a focus ring and a processing method using the semiconductor manufacturing device.

DETAILED DESCRIPTION OF THE EMBODIMENT

Figure 1:
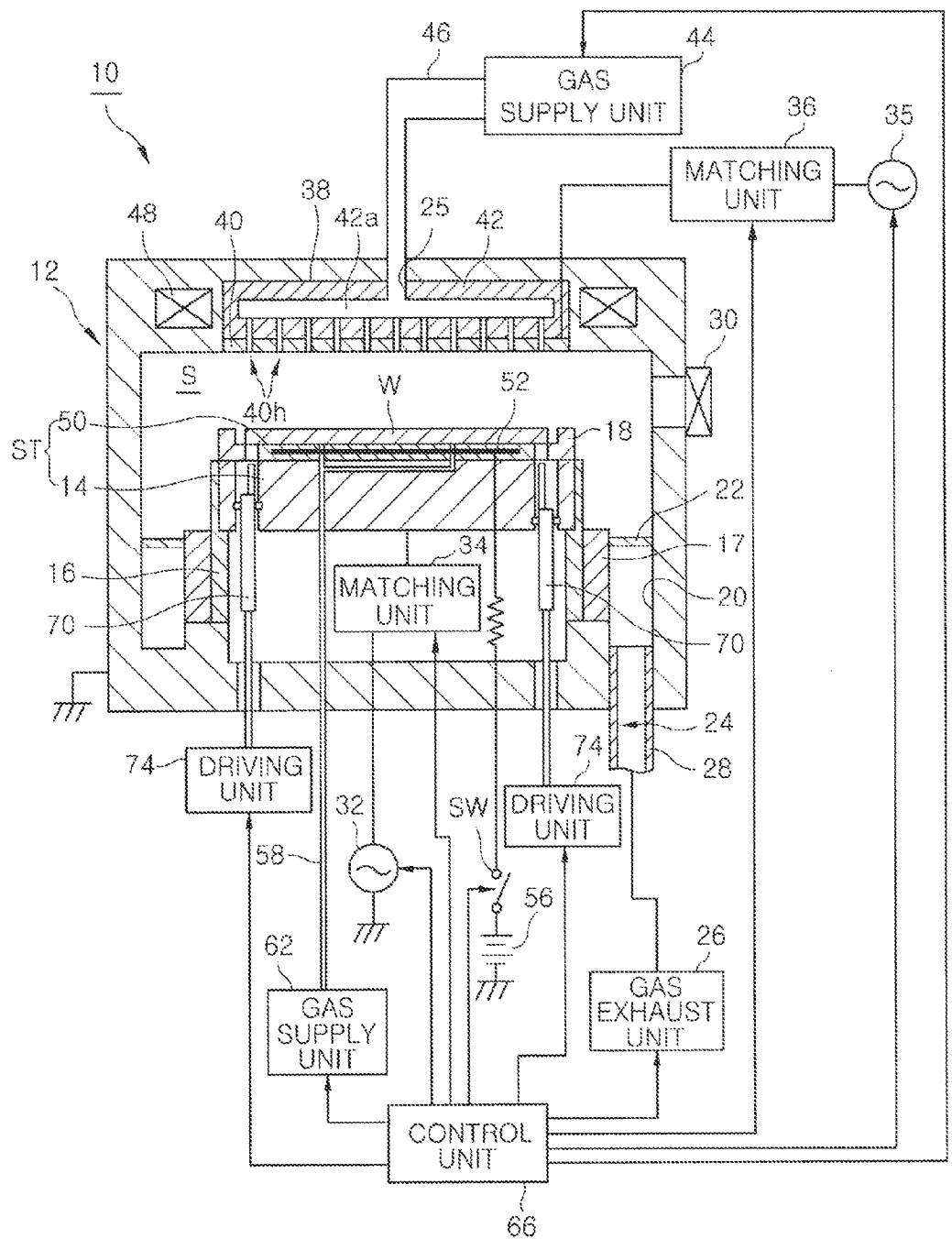
FIG. 1 schematically shows a semiconductor manufacturing device in accordance with an embodiment.

Hereinafter, various aspects of an embodiment will be described in detail with reference to the accompanying drawings. Further, like reference numerals are used for like or corresponding parts throughout the drawings.

Figure 2:
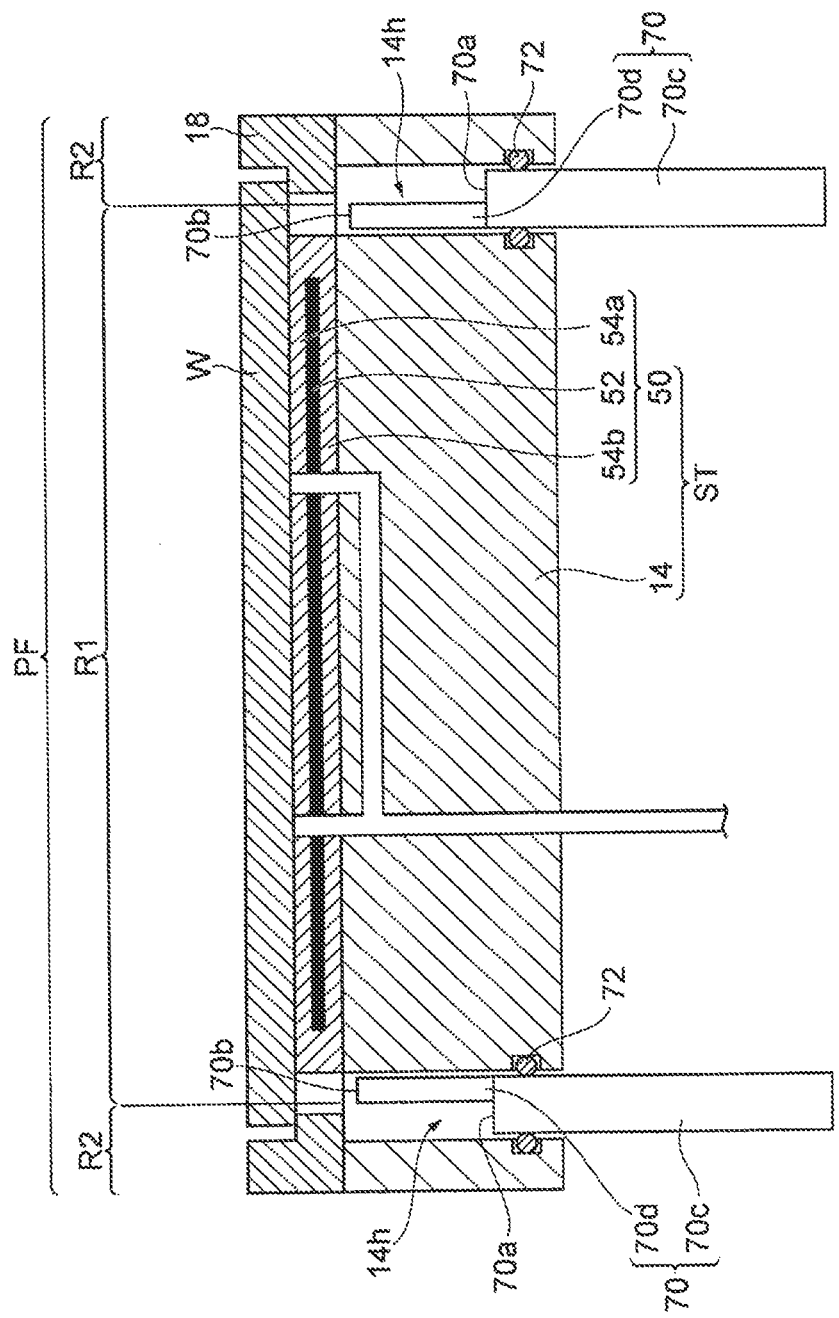
FIG. 2 is an enlarged cross sectional view of a stage, a plurality of pins and a driving unit of the semiconductor manufacturing device shown in FIG. 1.

FIG. 1 schematically shows a semiconductor manufacturing device in accordance with an embodiment. In FIG. 1, there is illustrated a cross section of the semiconductor manufacturing device of the present embodiment. FIG. 2 is an enlarged cross sectional view of a stage, a plurality of pins and a driving unit of the semiconductor manufacturing device shown in FIG. 1.

As shown in FIG. 1, the semiconductor manufacturing device 10 of the present embodiment may be a parallel plate type plasma processing apparatus. The semiconductor manufacturing device 10 includes a processing chamber 12. The processing chamber 12 is formed in a substantially cylindrical shape, which defines a processing space S as its internal space. The semiconductor manufacturing device 10 has a stage ST in the processing chamber 12. In the present embodiment, the stage ST has a table 14 and an electrostatic chuck 50. The table 14 has a substantially circular plate shape and is provided at a lower portion of the processing space S. The table 14 is made of, e.g., aluminum, and serves as a lower electrode.

In the present embodiment, the semiconductor manufacturing device 10 further includes a cylindrical holding portion 16 and a cylindrical supporting portion 17. The cylindrical holding portion 16 holds the table 14 while being in contact with the side surface and an edge portion of the bottom surface of the table 14. The cylindrical supporting portion 17 extends from the bottom portion of the processing chamber 12 in a vertical direction and supports the table 14 through the cylindrical holding portion 16.

The semiconductor manufacturing device 10 further includes a focus ring 18. As shown in FIG. 2, the focus ring 18 is mounted on a peripheral portion of the top surface of the table 14. The focus ring 18 is a member for improving the in-plane uniformity of the processing accuracy of the substrate W. The focus ring 18 is a plate-shaped member having a substantial ring shape and may be formed of, e.g., silicon, quartz or silicon carbide.

In the present embodiment, a gas exhaust path 20 is formed between the sidewall of the processing chamber 12 and the cylindrical supporting unit 17. A baffle plate 22 is provided at the inlet or in the middle of the gas exhaust path 20. Further, a gas exhaust port 24 is provided at the bottom of the gas exhaust path 20. The gas exhaust port 24 is formed by a gas exhaust pipe 28 inserted into the bottom portion of the processing chamber 12. A gas exhaust unit 26 is connected to the gas exhaust pipe 28. The gas exhaust unit 26 has a vacuum pump and can decrease a pressure in the processing space S of the processing chamber 12 to a predetermined vacuum level. A gate valve 30 for opening/closing a loading/unloading port for the substrate W is provided at the sidewall of the processing chamber 12.

A high frequency power supply 32 for plasma generation is electrically connected to the table 14 via a matching unit 34. The high frequency power supply 32 applies a high frequency power at a predetermined high frequency (e.g., 13 MHz) to the lower electrode, i.e., the table 14.

Further, the semiconductor manufacturing device 10 has a shower head 38 in the processing chamber 12. The shower head 38 is provided above the processing space S. The shower head 38 has an electrode plate 40 and an electrode holding body 42.

The electrode plate 40 is a substantially circular conductive plate and serves as an upper electrode. A high frequency power supply 35 for plasma generation is electrically connected to the electrode plate 40. The high frequency power supply 35 applies a high frequency power at a predetermined high frequency (e.g., 60 MHz) to the electrode plate 40. When the high frequency power is applied to the table 14 and the electrode plate 40 by the high frequency power supplies 32 and 35, a high frequency electric field is generated in the space between the table 14 and the electrode plate 40, i.e., the processing space S.

A plurality of gas holes 40 is formed in the electrode plate 40. The electrode plate 40 is detachably held by the electrode holding body 42. A buffer space 42a is provided in the electrode holding body 42. The semiconductor manufacturing device 10 further includes a gas supply unit 44 which is connected to the gas inlet port 25 of the buffer space 42a through a gas supply pipe 46. The gas supply unit 44 supplies a processing gas into the processing space S. The processing gas may be, e.g., an etching gas or a film forming gas. A plurality of holes communicating with the gas holes 40h is formed in the electrode holding body 42, and the corresponding holes communicate with the buffer space 42a. The gas is supplied to the processing space S from the gas supply unit 44 through the buffer space 42a and the gas holes 40h.

In the present embodiment, a magnetic field forming mechanism 48 extending in a ring shape or a concentric shape is provided at the ceiling portion of the processing chamber 12. The magnetic field forming mechanism 48 is configured to efficiently start high frequency electric discharge (plasma ignition) and stably maintain the electric discharge in the processing space S.

In the semiconductor manufacturing device 10, the electrostatic chuck 50 is provided on the top surface of the table 14. As shown in FIG. 2, the electrostatic chuck 50 includes an electrode 52 and a pair of insulating films 54a and 54b. The electrode 52 is a conductive film and is provided between the insulating films 54a and 54b. As shown in FIG. 1, a DC power supply 56 is connected to the electrode 52 through a switch SW. When a DC voltage is applied from the DC power supply 56 to the electrode 52, a Coulomb force is generated and the substrate W is attracted and held on the electrostatic chuck 50 by the Coulomb force.

In the present embodiment, the semiconductor manufacturing device 10 further includes a gas supply line 58 and a heat transfer gas supply unit 62. The heat transfer gas supply unit 62 is connected to the gas supply line 58. The gas supply line 58 extends to the top surface of the electrostatic chuck 50 and extends in a ring shape at the top surface. The heat transfer gas supply unit 62 supplies a heat transfer gas, e.g., He gas, to a gap between the top surface of the electrostatic chuck 50 and the substrate W.

In the present embodiment, the semiconductor manufacturing device 10 further includes a control unit 66. The control unit 66 is connected to the gas exhaust unit 26, the switch SW, the high frequency power supply 32, the matching unit 34, the high frequency power supply 35, the matching unit 36, the gas supply unit 44 and the heat transfer gas supply unit 62. The control unit 66 transmits a control signal to each of the gas exhaust unit 26, the switch SW, the high frequency power supply 32, the matching unit 34, the high frequency power supply 35, the matching unit 36, the gas supply unit 44 and the heat transfer gas supply unit 62. The exhaust by the gas exhaust unit 26, the opening/closing of the switch SW, the power supply from the high frequency power supply 32, the impedance adjustment of the matching unit 34, the power supply from the high frequency power supply 35, the impedance adjustment of the matching unit 36, the supply of the processing gas by the gas supply unit 44, and the supply of the heat transfer gas by the heat transfer gas supply unit 62 are controlled by the control signals from the control unit 66.

In this semiconductor manufacturing device 10, a processing gas is supplied from the gas supply unit 44 to the processing space S. Further, a high frequency electric field is formed between the electrode plate 40 and the table 14, i.e., in the processing space S. Accordingly, a plasma is generated in the processing space S, and the substrate W is processed by radicals or the like of elements contained in the processing gas. Moreover, the processing of the substrate W may be any processing, e.g., etching of the substrate W or the film formation on the substrate W. However, it is not limited thereto.

Hereinafter, the configurations of the stage, the pins and the driving unit will be described in detail with reference to FIGS. 1 and 2. The stage ST has a mounting surface PF. The mounting surface PF has a first and a second region R1 and R2. The first region R1 is a region for mounting thereon the substrate W. In the present embodiment, the first region R1 is defined by the top surface of the electrostatic chuck 50 and has a substantially circular region. The second region R2 is a region for mounting thereon the focus ring 18, and is formed in a ring shape to surround the first region R1. In the present embodiment, the second region R2 is defined by the peripheral portion of the top surface of the table 14.

The stage ST has a plurality of holes 14h. The holes 14h extend in a direction (vertical direction) that intersects the mounting surface PF of the stage ST while passing through a boundary between the first region R1 and the second region R1. These holes 14h are arranged at a regular interval along the circumferential direction, and the number of the holes 14h is three or more.

A plurality of pins 70 is respectively provided in the plurality of holes 14h. Each of the pins 70 has a first and a second upper end surface 70a and 70b. In the present embodiment, each of the pins 70 includes a first and a second columnar portion 70c and 70d. The first columnar portion 70c is provided below the second columnar portion 70d. The diameter of the first columnar portion 70c is greater than that of the second columnar portion 70d.

The upper end surface of the first columnar portion 70c serves as the first upper end surface 70a. The second columnar portion 70d extends upward from the upper end surface of the first columnar portion 70c. The upper end surface of the second columnar portion 70d forms the second upper end surface 70b. The central axial line of the second columnar portion 70d is offset towards the first region R1 with respect to the central axial line of the first columnar portion 70c. In other words, the second end surface 70b is offset further towards the first region R1 with respect to the first upper end surface 70a. Accordingly, when the pins 70 are moved upward, the upper end surface of the second columnar portion 70d does not come into contact with the focus ring 18.

In the present embodiment, a seal member 72 such as an O-ring or the like is provided between the first columnar portion 70c of each pin 70 and the surface of the table 14 which defines the hole 14h corresponding to the second columnar portion 70c, i.e., the inner surface defining the hole 14h. Each of the holes 14h is sealed by the seal member 72. As a result, the airtightness of the processing space S is ensured.

As shown in FIG. 1, each of the pins 70 is connected to each of a plurality of driving units 74. Each of the driving units 74 generates a driving force for vertically moving, e.g., elevating, the corresponding pin 70. Any driving unit for vertically moving the pin 70 may be employed as the driving unit 74. For example, the driving units 74 may have a hydraulic or a pneumatic cylinder.

The control unit 66 may be connected to the driving units 74. In other words, the vertical movement of the pins 72 may be controlled by the control signal applied from the control unit 66 to the driving units 74. In the present embodiment, the control unit 66 controls, in a first mode, the driving units 74 to drive the pins 70 such that the second upper end surface 70b of each pin 70 protrudes upward beyond the mounting surface PF. In the first mode, the second upper end surfaces 70b of the pins 70 come into contact with the substrate W, and the substrate W is lifted up from the mounting surface PF (first region R1) by the pins 70. The substrate W lifted from the mounting surface PF is unloaded from the processing chamber 12 through the gate valve 30 by the transfer unit such as a robot arm or the like.

Further, the control unit 66 controls, in a second mode, the driving units 74 to drive the pins 70 such that the first upper end surface 70a of each pin 70 protrudes upward beyond the mounting surface PF. In the second mode, the first upper end surfaces 70a of the pins 70 come into contact with the focus ring, and the focus ring 18 is lifted from the mounting surface PF (second region R2) by the pins 70. The focus ring 18 lifted from the mounting surface PF is unloaded to the outside of the processing chamber 12 through the gate valve 30 by the transfer unit such as a robot arm or the like.

As described above, in the semiconductor manufacturing device 10, each of the pins 70 has the second upper end surface 70b for upwardly lifting the substrate W and the first upper end surface 70a for upwardly lifting the focus ring 18. Accordingly, the lifting of the substrate W and the focus ring 18 from the stage ST can be realized with a small number of pins.

Figure 3:
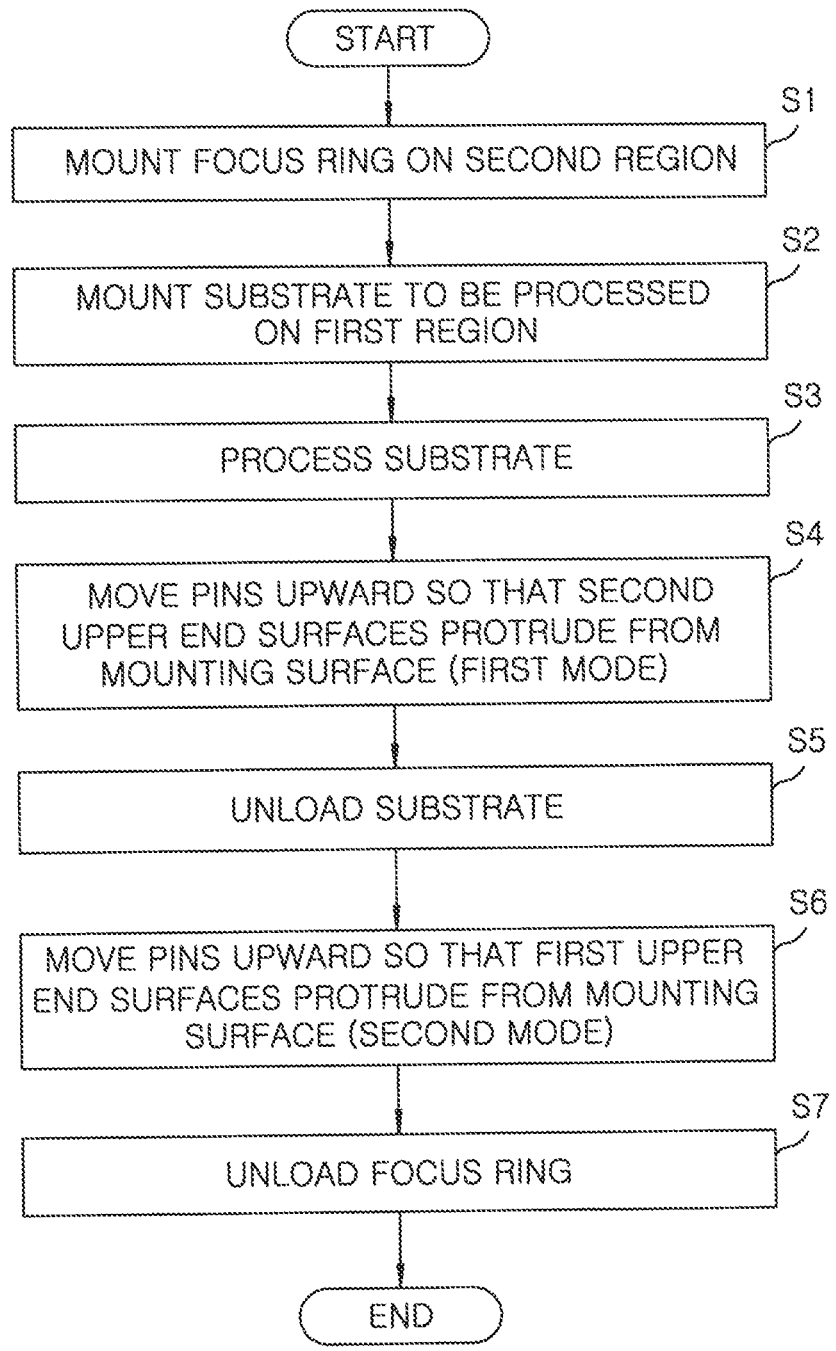
FIG. 3 is a flowchart showing a processing method in accordance with an embodiment.

Hereinafter, a processing method using the semiconductor manufacturing apparatus in accordance with the present embodiment will be described. FIG. 3 is a flowchart showing a processing method in accordance with an embodiment. The processing method described in FIG. 3 may be performed by using the semiconductor manufacturing device 10. According to the processing method described in FIG. 3, in a step S1, the focus ring 18 is to be mounted on the second region R2. In the step S1, the pins 70 are set in a state of being accommodated in the respective holes 14h, i.e., a state in which the second upper end surfaces 70b are disposed below the mounting surface PF.

In that state, the focus ring 18 is guided to a predetermined position in the processing space S, i.e., to a position above the second region R2, through the gate valve 30 by the transfer unit such as a robot arm or the like. Next, the pins 70 are moved upward so that the first upper end surfaces 70a come into contact with the backside of the focus ring 18.

Thereafter, the transfer unit is moved to the outside of the processing chamber 12 and, then, the pins 70 are moved downward. Accordingly, the focus ring 18 is mounted on the second region R2.

In a next step S2, a substrate W to be processed is to be mounted on the first region R1. In the step S2, the pins 70 are set in a state of being accommodated in the respective holes 14h, i.e., a state in which the second upper end surfaces 70b are disposed below the mounting surface PF. In that state, the substrate W is guided to a predetermined position in the processing space S, i.e., to a position above the first region R1, through the gate valve 30 by the transfer unit such as a robot arm or the like. Next, the pins 70 are moved upward so that the second upper end surfaces 70b come into contact with the backside of the substrate W. Thereafter, the transfer unit is moved to the outside of the processing chamber 12 and, then, the pins 70 are moved downward. Accordingly, the substrate W is mounted on the first region R1.

In a next step S3, the substrate W is processed. In the step S3, a processing such as plasma etching, film formation or the like is performed in the processing space S.

Figure 4:
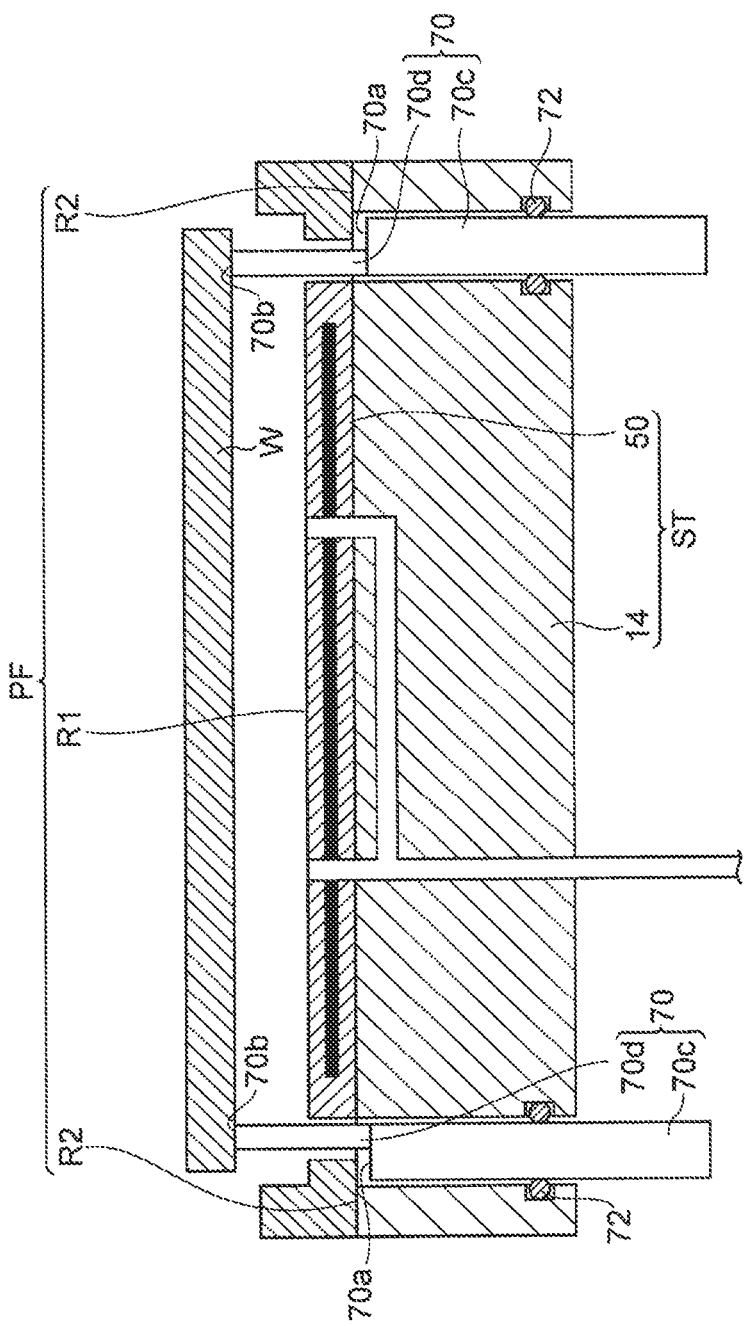
FIG. 4 is a cross sectional view showing positions of the pins in a step S3 of the flowchart shown in FIG. 3.

In a next step S4, the pins 70 are moved upward so that the second upper end surfaces 70b protrude beyond the mounting surface PF. FIG. 4 is a cross sectional view showing the positions of the pins in the step S4. As shown in FIG. 4, in the step S4, the second upper end surfaces 70b come into contact with the backside of the processed substrate W, and the processed substrate W is lifted up from the mounting surface PF (the first region R1) by the pins 70. Further, in the step S4, the first upper end surfaces 70a are positioned below the mounting surface PF, i.e., below the backside of the focus ring 18.

In a next step S5, the processed substrate W is unloaded from the processing chamber 12. Specifically, the transfer arm such as a robot arm or the like is moved into the processing chamber 12 through the gate valve 30. Next, the processed substrate W is held by the transfer unit. Thereafter, the pins 70 are moved downward and, then, the processed substrate W is unloaded to the outside of the processing chamber 12 by the transfer unit. Further, the steps S2 to S5 may be executed more than once while exchanging the substrates W.

Figure 5:
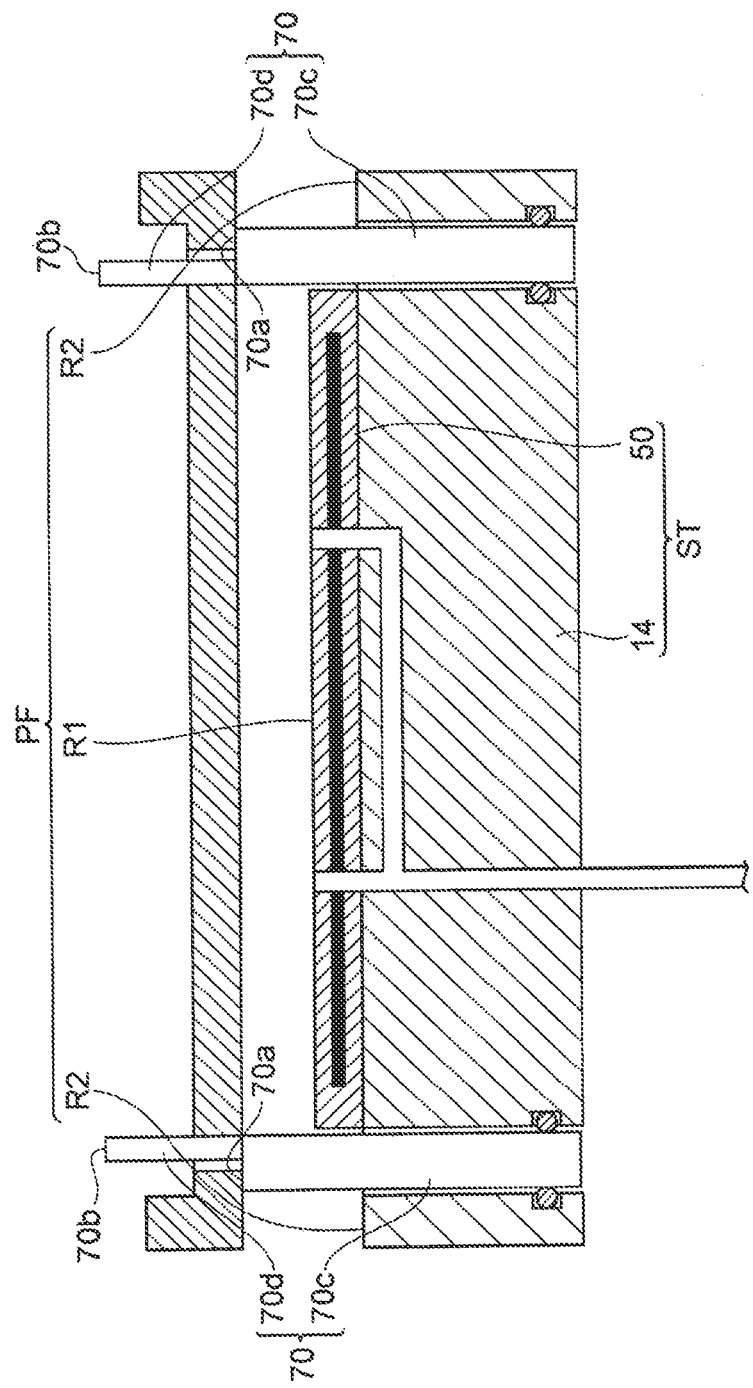
FIG. 5 is a cross sectional view showing positions of the pins in a step S6 of the flowchart shown in FIG. 3.

In a next step S6, in a state where the processed substrate W is unloaded from the processing chamber 12, the pins 70 are moved upward so that the first upper end surfaces 70a protrude beyond the mounting surface PF. FIG. 5 is a cross sectional view showing the positions of the pins in the step S6 of FIG. 3. As shown in FIG. 5, in the step S6, the first upper end surfaces 70a come into contact with the backside of the focus ring 18, and the focus ring 18 is lifted up from the mounting surface PF (the second region R2) by the pins 70.

In a next step S7, the focus ring 18 is unloaded to the outside of the processing chamber 12. Specifically, the transfer arm such as a robot arm or the like is moved into the processing chamber 12 through the gate valve 30. Next, the focus ring 18 is held by the transfer unit. Thereafter, the pins 70 are moved downward so as not to interfere with the focus ring 18 and, then, the focus ring 18 is unloaded to the outside of the processing chamber 12 by the transfer unit. Accordingly, the focus ring 18 that needs to be exchanged can be unloaded from the processing chamber 12 and, then, the processes from the step S1 can be repeated.

Figure 6:
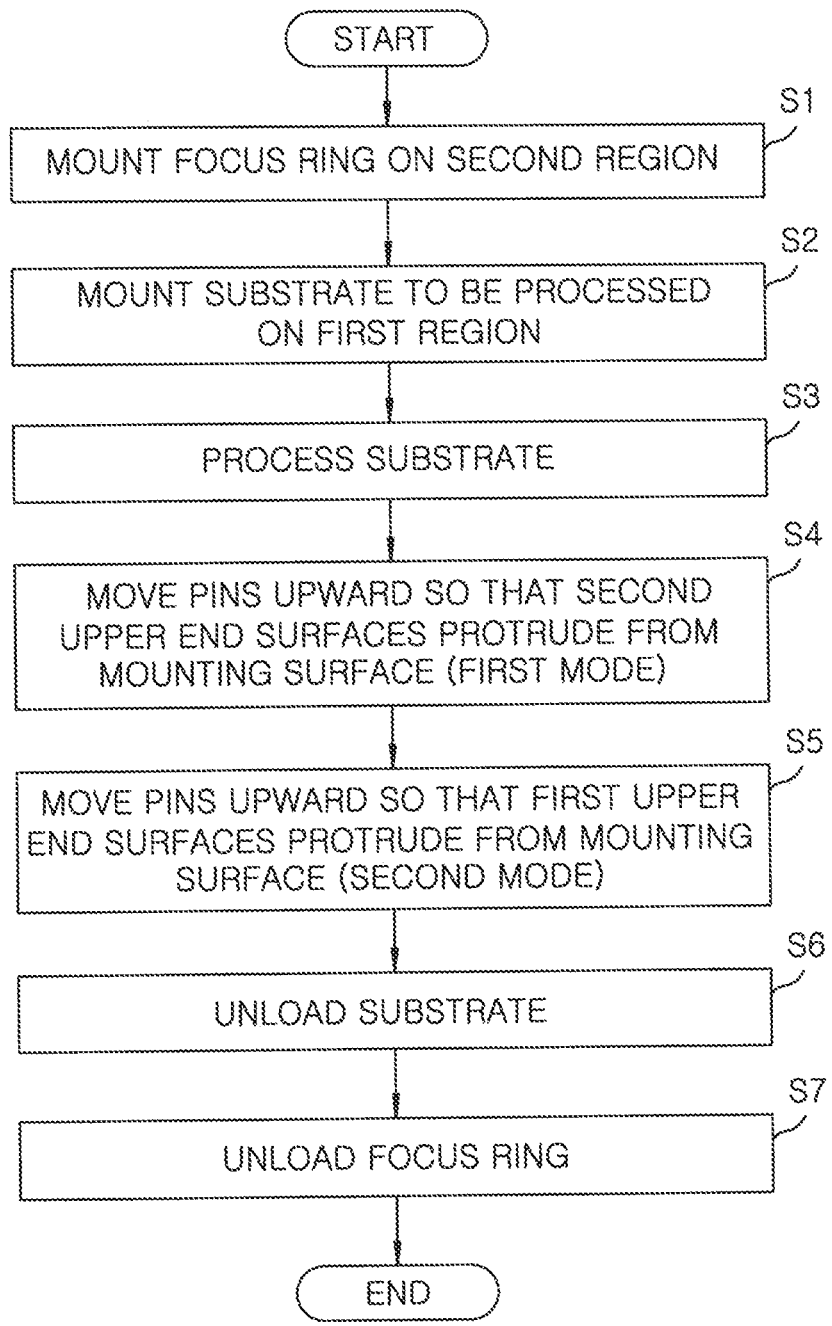
FIG. 6 is a flowchart showing a processing method in accordance with another embodiment.

Hereinafter, a processing method in accordance with another embodiment which can be performed by using the semiconductor manufacturing device 10 will be described with reference to FIG. 6. FIG. 6 is a flowchart showing the processing method of another embodiment. According to another embodiment, in a step S1, the pins 70 are set in a state of being accommodated in the respective holes 14h, i.e., a state in which the second upper end surfaces 70b are disposed below the mounting surface PF. In that state, the focus ring 18 is guided to a predetermined position in the processing space S, i.e., to a position above the second region R2, through the gate valve 30 by the transfer unit such as a robot arm or the like. Further, a substrate W to be processed is guided to another predetermined position, i.e., a position above the first region R1.

Next, the pins 70 are moved upward so that the first upper end surfaces 70a come into contact with the backside of the focus ring 18 and the second upper end surfaces 70b come into contact with the backside of the substrate W. Then, the transfer unit is moved to the outside of the processing chamber 12. At this time, the substrate W to be processed and the focus ring 18 are simultaneously held by the pins 70 above the mounting surface PF. Thereafter, the pins 70 are moved downward. Accordingly, first, in the step S1, the focus ring 18 is mounted on the second region R2. Next, in a step S2, the substrate W to be processed is mounted on the first region R1 by moving further downward the pins 70.

Figure 7:
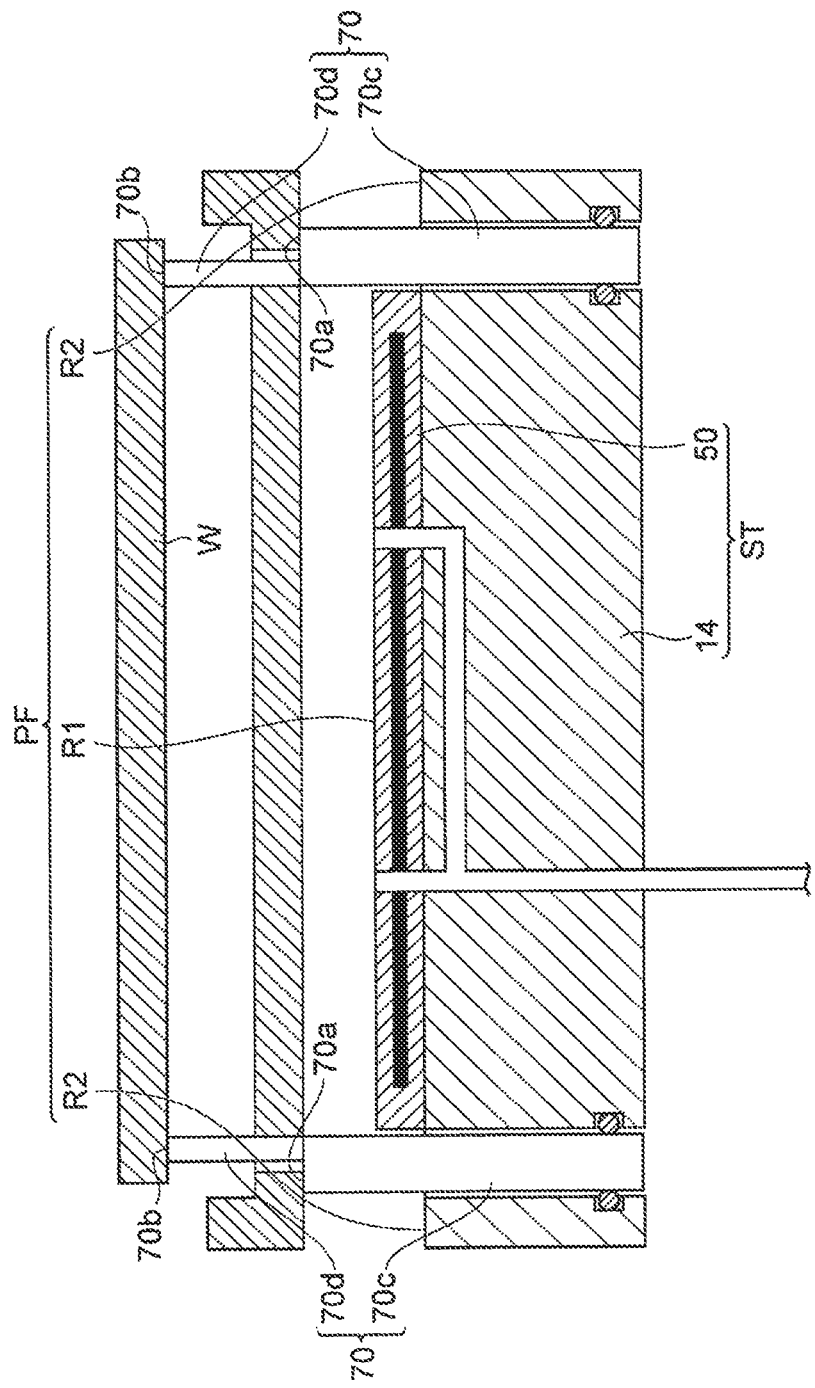
FIG. 7 is a cross sectional view showing positions of the pins in a step S6 of the flowchart shown in FIG. 6.

According to another embodiment, in a step S3, the substrate W to be processed is processed. After a step S4 is executed, a step S6 is executed. In other words, in another embodiment, the pins 70 are moved upward and the processed substrate W is lifted up from the mounting surface PF (the first region R) by the pins 70, in the step S4. Further, in the step S6 executed after the step S4, the pins 70 are further moved upward, and the focus ring 18 is lifted up from the mounting surface PF (the second region R2) by the pins 70. FIG. 7 is a cross sectional view showing the positions of the pins in the step S6 of FIG. 6. When the step S6 of FIG. 6 is executed, the second upper end surfaces 70b of the pins 70 come into contact with the backside of the processed substrate W and the first upper end surfaces 70a of the pins 70 come into contact with the backside of the focus ring 18, as shown in FIG. 7. At this time, the processed substrate W and the focus ring 18 are simultaneously held by the pins 70 above the mounting surface PF.

Next, steps S5 and S7 are executed simultaneously. In other words, the transfer unit such a robot arm or the like is moved into the processing chamber 12 through the gate valve 30, and the processed substrate W and the focus ring 18 are held by the transfer unit. Further, the pins 70 are moved downward so as not to interfere with the focus ring 18 and the processed substrate W, and the processed substrate W and the focus ring 18 are unloaded to the outside of the processing chamber 12 by the transfer unit. By unloading the processed substrate W and the focus ring 18 from the processing chamber 12 in a state where the processed substrate W and the focus ring 18 simultaneously held by the pins 70, the throughput can be improved.

While various embodiments have been described, various modifications may be made without being limited to the above embodiments. For example, the aforementioned semiconductor manufacturing device 10 is a parallel plate type plasma processing apparatus, but the idea of the aforementioned aspects and embodiments in accordance with the present invention may be applied to a plasma processing apparatus having any plasma generation source. Further, the idea of the aforementioned aspects and embodiments of the present invention are not limited to the plasma processing apparatus and may also be applied to any semiconductor manufacturing device for mounting a substrate W to be processed and a focus ring on a stage in a processing space and processing the substrate W.

DESCRIPTION OF REFERENCE NUMERALS

10 . . . semiconductor manufacturing device,
12 . . . processing chamber,
14 . . . table,
14h . . . hole,
18 . . . focus ring,
50 . . . electrostatic chuck,
66 . . . control unit,
70 . . . pin,
70a . . . first upper end surface,
70b . . . second upper end surface,
70c . . . first columnar portion,
70d . . . second columnar portion,
72 . . . seal member,
74 . . . driving unit,
PF . . . mounting surface,
R1 . . . first region,
R2 . . . second region,
S . . . processing space,
ST . . . stage,
W . . . substrate.

What is claimed is:

1. A semiconductor manufacturing device comprising:
a processing chamber defining a processing space;
a stage provided in the processing chamber, the stage having a mounting surface which has a first region for mounting thereon a substrate to be processed and a second region for mounting thereon a focus ring, and having a plurality of holes extending in a direction that intersects the mounting surface, the second region of the mounting surface being disposed to surround the first region of the mounting surface;
a plurality of pins which are respectively provided in the holes, each pin having a first upper end surface configured to lift up the focus ring from the second region of the mounting surface and a second upper end surface configured to lift up the substrate from the first region of the mounting surface, wherein the second upper end surface is offset towards the first region of the mounting surface with respect to the first upper end surface and wherein the second upper end surface is located above the first upper end surface;
a driving unit configured to vertically move the pins in the extending direction of the holes; and
a control unit configured to (i) control, in a first mode of lifting up the substrate, the driving unit to move upward the pins to a first height such that the second upper end surfaces of the pins protrude above the first region of the mounting surface to lift the substrate while the first upper end surfaces of the pins are maintained below the second region of the mounting surface and do not lift the focus ring, and (ii) control, in a second mode of lifting up the focus ring, the driving unit to move upward the pins to a second height greater than the first height such that the first upper end surfaces of the pins protrude above the second region of the mounting surface to lift the focus ring,
wherein the first upper end surfaces of the pins are configured to move in unison with the second upper end surfaces of the pins.

2. The semiconductor manufacturing device of claim 1,
wherein each pin includes a first columnar portion and a second columnar portion,
wherein the first columnar portion includes the second upper end surface and the second columnar portion includes the first upper end surface, and
wherein a thickness of the first columnar portion is less than a thickness of the second columnar portion.

3. A semiconductor manufacturing device comprising:
a processing chamber defining a processing space;
a stage provided in the processing chamber, the stage having a mounting surface which has a first region for mounting thereon a substrate to be processed and a second region for mounting thereon a focus ring, and having a plurality of holes extending in a direction perpendicular to the mounting surface, the second region of the mounting surface being disposed to surround the first region of the mounting surface;
a plurality of pins which are respectively provided in the holes, each pin including a first columnar portion and a second columnar portion provided above the first columnar portion, the first columnar portion having a first upper end surface configured to lift up the focus ring from the second region of the mounting surface and the second columnar portion having a second upper end surface configured to lift up the substrate from the first region of the mounting surface, wherein the second upper end surface is offset towards the first region of the mounting surface with respect to the first upper end surface and wherein the second upper end surface is located above the first upper end surface;
a driving unit configured to vertically move the pins in the extending direction of the holes; and
a control unit configured to (i) control, in a first mode of lifting up the substrate, the driving unit to move upward the pins to a first height such that the second upper end surfaces of the pins protrude above the first region of the mounting surface to lift the substrate while the first upper end surfaces of the pins are maintained below the second region of the mounting surface and do not lift the focus ring, and (ii) control, in a second mode of lifting up the focus ring, the driving unit to move upward the pins to a second height greater than the first height such that the first upper end surfaces of the pins protrude above the second region of the mounting surface to lift the focus ring,
wherein the first upper end surfaces of the pins are configured to move in unison with the second upper end surfaces of the pins.

* * * * *